(12) United States Patent
Kim et al.

(10) Patent No.: US 6,492,763 B2
(45) Date of Patent: Dec. 10, 2002

(54) PIEZOELECTRIC CERAMIC COMPOSITION, AND HIGH POWER OUTPUT TRANSFORMER MADE OF THE SAME COMPOSITION

(75) Inventors: Jong Sun Kim, Suwon (KR); Choong Sik Yoo, Yongin (KR); Joo Hyun Yoo, Jechon (KR); Yong Woo Lee, Uijungbu (KR)

(73) Assignee: Samsung Electro-Mechanics Co., Ltd., Kyungki-Do (KR)

(*) Notice: Subject to any disclaimer, the term of this patent is extended or adjusted under 35 U.S.C. 154(b) by 21 days.

(21) Appl. No.: 09/723,670

(22) Filed: Dec. 5, 2000

(65) Prior Publication Data

US 2001/0054704 A1 Dec. 27, 2001

(30) Foreign Application Priority Data

May 4, 2000 (KR) .............................. 00-23902

(51) Int. Cl.[7] .............................................. H01L 41/08
(52) U.S. Cl. ..................... 310/358; 310/359; 252/62.9
(58) Field of Search ............................ 310/358, 359, 310/366; 252/62.9

(56) References Cited

U.S. PATENT DOCUMENTS

| | | | | | |
|---|---|---|---|---|---|
| 4,367,426 A | * | 1/1983 | Kumada et al. | ............ | 310/358 |
| 4,876,148 A | * | 10/1989 | Virkar | .................... | 428/384 |
| 6,104,128 A | * | 8/2000 | Fujii et al. | ................... | 310/358 |
| 6,118,209 A | * | 9/2000 | Okoyama et al. | ........... | 310/358 |
| 6,288,479 B1 | * | 9/2001 | Watanabe | .................... | 310/359 |

* cited by examiner

Primary Examiner—Mark O. Budd
(74) Attorney, Agent, or Firm—Lowe Hauptman Gilman & Berner, LLP

(57) ABSTRACT

A piezoelectric ceramic composition in which the dielectric constant, the mechanical quality factor Qm and the electromechanical coupling factor Kp are superior, and a high power output piezoelectric transformer made of it are disclosed.

The piezoelectric ceramic composition according to the present invention is composed of $Pb[(Sb_{1/2}Nb_{1/2})_x(Zr_{0.495}Ti_{0.505})_{1-x}]O_3+yPbO+zMnO$, where x is 0.01–0.05 mol %, y is 0.03–0.6 wt %, and z is 0.7 wt % or less.

The piezoelectric transformer according to the present invention includes: a piezoelectric block composed of the same composition; a first electrode consists of an inner electrode and an outer electrode, the inner electrode being formed at the center of the top of the piezoelectric block, and the outer electrode being formed around the inner electrode by being separated by an isolating region; and a second electrode is formed on the bottom of the piezoelectric block.

6 Claims, 8 Drawing Sheets

(PRIOR ART)

PIEZOELECTRIC CERAMIC COMPOSITION, AND HIGH POWER OUTPUT TRANSFORMER MADE OF THE SAME COMPOSITION

BACKGROUND OF THE INVENTION

1. Field of the Invention

The present invention relates to a piezoelectric ceramic composition for use in a piezoelectric transformer and the like. Particularly, the present invention relates to a piezoelectric ceramic composition in which the mechanical quality factor Qm, the electromechanical coupling factor Kp and the dielectric constant are superior, and to a high power output piezoelectric transformer made of the same composition.

2. Description of the Prior Art

The discovery of the piezoelectric ceramic was such that $BaTiO_3$ was discovered at the middle of 1940s, and then, $Pb(Zr,Ti)O_3$ (to be called simply "PZT" below) having more superior piezoelectric properties was developed thereafter. This material has been widely applied to high voltage generators, ultrasonic apparatuses, sound apparatuses, communication apparatuses, and other various sensors.

PZT is a solid solution form of $PbZrO_3$, and $PbTiO_3$, and has a perovskite structure, while it has superior piezoelectric properties. In order to make the composition variation easier than this two-component system and to improve the piezoelectric properties, there have been developed three-component system composite perovskite compounds. Among these three-component system compounds, attention has been focused on: $Pb(Mg,Nb)O_3$—$Pb(Zr,Ti)O_3$, $Pb(Mg,Ta)O_3$—$Pb(Zr,Ti)O_3$, and $Pb(Mn,Nb)O_3$—$Pb(Zr,Ti)O_3$.

Recently there has been reported a piezoelectric ceramic composition in which the sintering density is improved, and the electromechanical coupling factor is raised to 0.57 by the PSN-PZT series, that is, $\{Pb[(Sb_{1/2}Nb_{1/2})O_3$—PZT series+$MnO_2\}$ (Hiromu Ohuchi; J. Appl. Phys. Vol. 34 (1995) PP 5298–5302). However, this ceramic composition is low in the dielectric constant (700) and in the mechanical quality factor (1,000), and therefore, it cannot be used in a high power output apparatuses.

The impedance of the general fluorescent lamps is as low as several hundred Ω to several Ω when lighted, whereas their output power is high i.e., in the order of 10–100 watts. If the piezoelectric ceramic material is to be used for a high power, first the generation of heat, the non-linearity, the degradation of the piezoelectric properties and the mechanical strength have to be solved. In order to achieve this, first the mechanical quality factor and the electromechanical coupling factor have to be high even under a high input power, so that the energy conversion efficiency can be improved to decrease the internal loss so as to decrease the thermal radiation. Second, the mechanical oscillations are high, and therefore, the grain size has to be made fine, thereby increasing the mechanical strength.

Figure 1A:
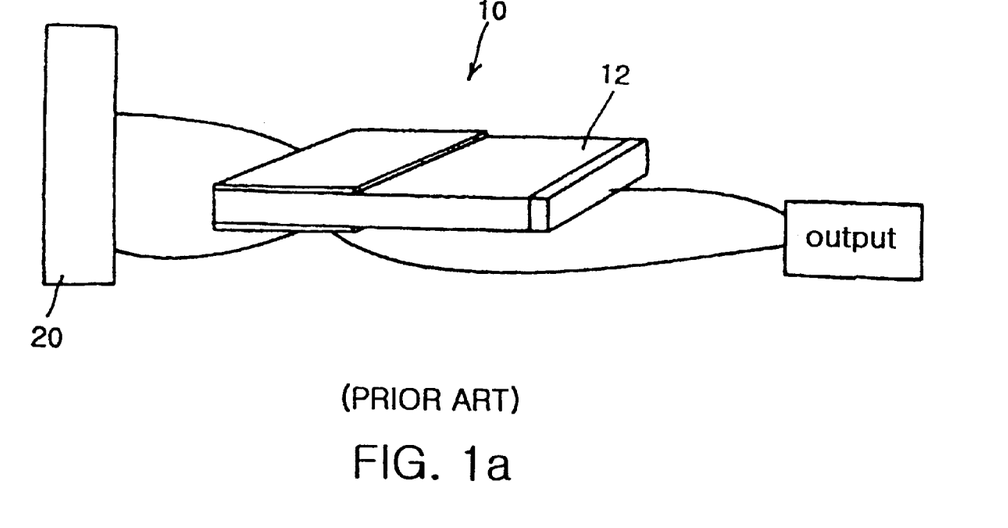
FIG. 1a is a perspective view.
Figure 1B:
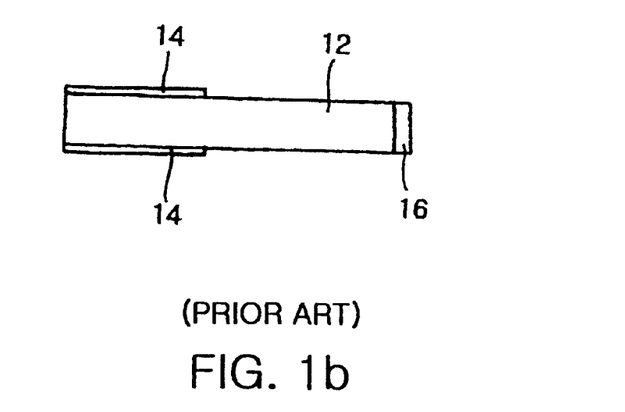
FIG. 1b is a side view.

If the piezoelectric material is to be used in the transformer for a high power fluorescent lamp, then the structure of the transformer as well as the physical properties of the material is important. FIG. 1 illustrates a typical example of a piezoelectric transformer which is used in an inverter. This transformer is the Rosen type in which the thickness oscillations and the lengthwise oscillations are utilized. The use of this transformer is limited to a high voltage low current output. In the piezoelectric transformer 10 of FIG. 1, a pair of input electrodes 14 are respectively formed on the bottom and top of a piezoelectric block 12, and the input electrodes 14 are polarized in the thickness direction. An output part consists of an electrode 16 which is attached on a side of the piezoelectric block, and is polarized in the length wise direction. If the piezoelectric transformer is to be stepped up, then an ac voltage corresponding to the resonance frequency is supplied to the input electrodes 14. Then the supplied electrical signals are converted to strong mechanical oscillations in the thickness direction near the input electrodes of the piezoelectric block 12. These oscillations lead to lengthwise oscillations of the output side, and consequently, a stepped-up high voltage with a frequency same as the input frequency is outputted through the output electrode 16. The stepping-up of the voltage becomes maximum when the frequency of the input voltage is same as the oscillation frequency of the output side. Under this condition, the ratio of the stepping-up of the piezoelectric transformer depends on the impedance of the load. That is, if a low impedance of load is connected to the output side, the ratio of the stepping-up becomes less than several scores. The magnitude of the load impedance is different depending on the kind of lamps in the case where the piezoelectric transformer is used in the cold cathode ray tube or in the fluorescent lamp. However, if the piezoelectric transformer is manufactured at the optimum conditions, then a high stepping-up ratio can be maintained. Thus in the normal case where a high impedance is connected before the lighting, and where the load impedance is lowered after the lighting, a sufficient stepping-up ratio can be maintained, so that it can be used in the cold cathode ray tube or in the fluorescent lamp.

Figure 2A:
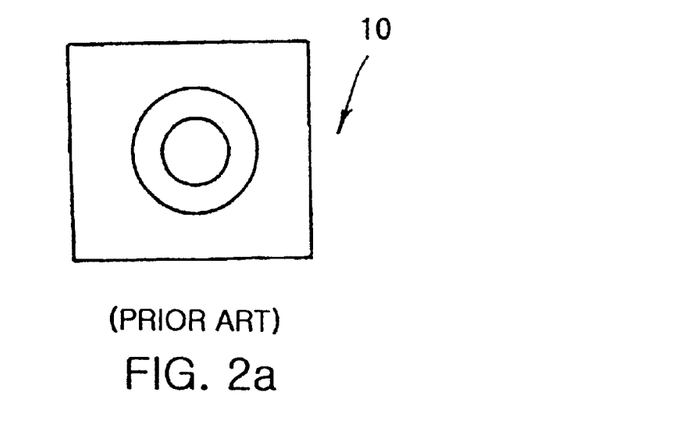
FIG. 2a is a plan view.
Figure 2B:
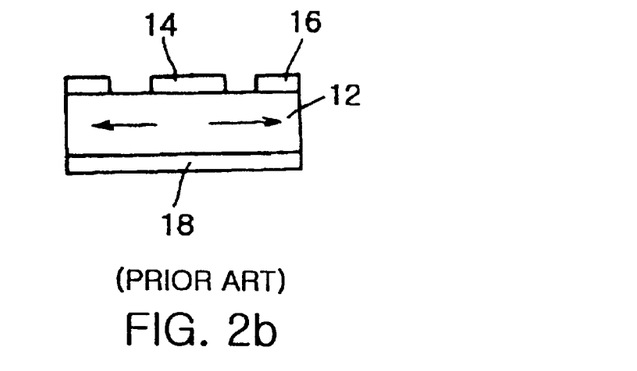
FIG. 2b is a side view.
Figure 2C:
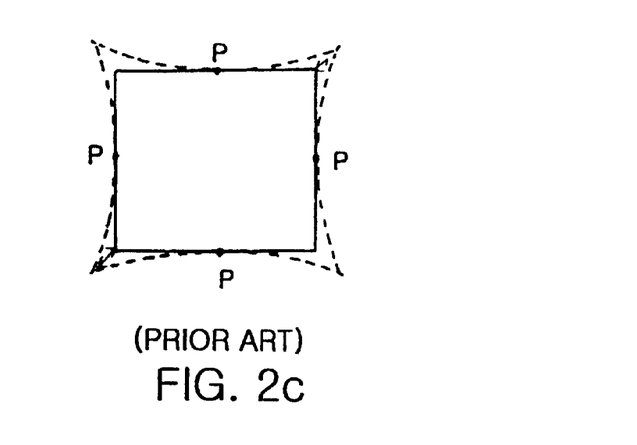
FIG. 2c illustrates the shape variations induced upon supplying a voltage.

Recently, there has been known a filter 10 in which the oscillation mode is as shown in FIG. 2. An input electrode 14 is formed on the top of a piezoelectric block 12, and an output electrode 16 is formed around the input electrode 14 keeping a certain distance from the latter. On the bottom of the piezoelectric block 12, there is formed a second electrode 18 which is a common electrode. If a voltage is supplied into the input electrode 14, then the supplied electrical signals are converted to mechanical oscillations from the center toward the peripheral portions, and then, output signals proportional to the mechanical oscillations are outputted through the output electrode 16. However, if this structure is used in a high power apparatus, then stress is imposed on the middle of the edge portions, with the result that the device is damaged or its efficiency is degraded.

As described above, if the piezoelectric ceramic is to be used in a high output power apparatus, then the problems of the dielectric constant, the mechanical quality factor Qm and the electromechanical coupling factor Kp have to be solved first, and a proper structure of the transformer has to be provided also.

SUMMARY OF THE INVENTION

The present invention is intended to solve the above described problems of the conventional techniques.

Therefore it is an object of the present invention to provide a piezoelectric ceramic composition in which the dielectric constant is 1,320 or more, the electromechanical coupling factor is 0.520 or more, and a mechanical quality factor is 1440 or more, and a high output power piezoelectric transformer obtained by using the piezoelectric ceramic composition.

It is another object of the present invention to provide a high output power piezoelectric transformer, in which the piezoelectric ceramic composition is used to construct the transformer so that the high output power characteristics are satisfied, and the operation is stable, by designing particular electrodes.

In achieving the above objects, the piezoelectric ceramic composition according to the present invention includes: $Pb[(Sb_{1/2}Nb_{1/2})_x(Zr_{0.495}Ti_{0.505})_{1-x}]O_3+yPbO+zMnO$, where x is 0.01–0.05 mol %, y is 0.03–0.6 wt %, and z is 0.7 wt % or less.

In another aspect of the present invention, the high output power piezoelectric transformer according to the present invention obtained by using a piezoelectric ceramic composition satisfying $Pb[(Sb_{1/2}Nb_{1/2})_x(Zr_{0.495}Ti_{0.505})_{1-x}]O_3+yPbO+zMnO$, where x is 0.01–0.05 mol %, y is 0.03–0.6 wt %, and z is 0.7 wt % or less.

In still another aspect of the present invention, the high output power piezoelectric transformer according to the present invention includes: a piezoelectric block composed of $Pb[(Sb_{1/2}Nb_{1/2})_x(Zr_{0.495}Ti_{0.505})_{1-x}]O_3+yPbO+zMnO$, where x is 0.01–0.05 mol %, y is 0.03–0.6 wt %, and z is 0.7 wt % or less; a first electrode consisting of an inner electrode and an outer electrode, the inner electrode being formed at the center of the top of the piezoelectric block, and the outer electrode being formed around the inner electrode by being separated by an isolating region; and a second electrode formed on the bottom of the piezoelectric block.

BRIEF DESCRIPTION OF THE DRAWINGS

The above objects and other advantages of the present invention will become more apparent by describing in detail the preferred embodiment of the present invention with reference to the attached drawings in which:

FIG. 1 is a schematic view of the conventional Rosen type piezoelectric transformer, in which

FIG. 2 is a schematic view of the conventional circumferential oscillation mode filter, in which

FIG. 3 is an embodiment of the piezoelectric transformer according to the present invention, in which

DETAILED DESCRIPTION OF THE PREFERRED EMBODIMENT

The piezoelectric ceramic composition according to the present invention includes the following ingredients. That is, to a two-component system of $Pb(Zr,Ti)O_3$, there are added:

[1] $Pb[(Sb_{1/2}Nb_{1/2})O_3$ for increasing the mechanical quality factor Qm and the electromechanical coupling factor Kp; and

[2] MnO for raising the dielectric constant so as to make the composition suitable to a high power output.

Now the reason for limiting the amount of the components in the composition of the present invention will be described.

In the component $(Sb_{1/2}Nb_{1/2})$ of the piezoelectric ceramic composition according to the present invention, x should be preferably 0.01 mol % or more for increasing the mechanical quality factor and the electromechanical coupling factor, but if it is more than 0.05 mol %, then the effect of the excess amount is not significant. Therefore, x should be preferably limited 0.01–0.05 mol %.

Meanwhile, in yPbO which is added for compensating the evaporation of PbO, y should be preferably limited to 0.3–0.6 wt %, and the reason is as follows. That is, if PbO is less than 0.3 wt %, PbO becomes insufficient for compensating the evaporation, while if it exceeds 0.6 wt %, then PbO becomes superfluously excessive.

Meanwhile, MnO improves the dielectric constant while not aggravating the mechanical quality factor. If its content exceeds 0.7 wt %, the dielectric constant is rather decreased, and therefore, it should be preferably 0.7 wt % or less.

Accordingly, by providing the above described piezoelectric ceramic composition, the following properties can be obtained. That is, the dielectric constant is 1,367 or more, the electromechanical coupling factor is 0.520 or more, and the mechanical quality factor is 1,440 or more.

Further, a piezoelectric transformer with high power output capability can be obtained by using the above described piezoelectric ceramic composition.

Meanwhile, the present invention also provides a piezoelectric transformer, in which the piezoelectric ceramic composition is used to construct the transformer so that the high output power characteristics are satisfied, and the operation is stable, by designing particular electrodes.

The present invention will be described by referring to the circumferential oscillating mode of FIG. 2 which shows the principles for the stepping-up of the voltage and the outputting of the stepped voltage, hereinafter.

That is, if electrical signals are inputted through the input electrode 14 and the second electrode 18 (which is the common electrode), these electrical signals are converted into mechanical oscillations in the piezoelectric block 12, and then, signals proportional to the mechanical oscillations are outputted through the output electrode 16.

The mentioned oscillations of the piezoelectric block 12 are largest at the four corners (in plane view), and are smallest at the middle portions of the four edges. The arrow marks of the four corners in FIG. 2 shows the magnitudes of the oscillations.

The magnitude of the oscillations can be different depending on the chemical composition and on the level of the applied voltage. To describe it in more detail, the mechanical oscillations are largest at the four corners of the piezoelectric block 12, while the oscillations are smallest at the middle portions (points P of FIG. 2) of the four edges. Accordingly, the center of the piezoelectric block 12 receives the largest amount of stress, and the middle portions of the four edges receive the next strong stress. Therefore, the generation of stress leads to the generation of heat at the middle portions of the edges, and consequently, the piezoelectric block 12 suffers a serious harm.

Generally, when electrical signals are inputted so as to be converted to mechanical oscillations, the oscillations occur most strongly near the input and output electrodes. Accordingly, if the size of the electrodes at the middle points P is reduced, then the level of the oscillations is reduced, with the result that the stress is less severely generated, thereby making it possible to decrease the generation of heat. Based on this principle, the present invention devised out an optimum pattern of the electrodes.

Figure 3A:
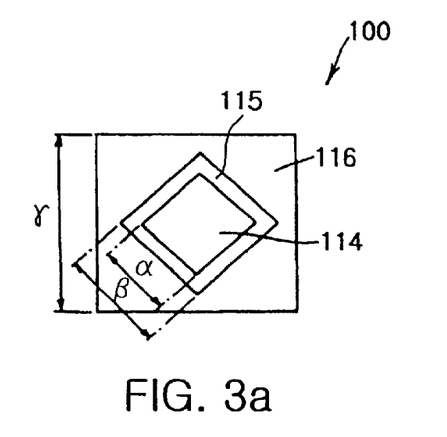
FIG. 3a is a plan view.
Figure 3B:
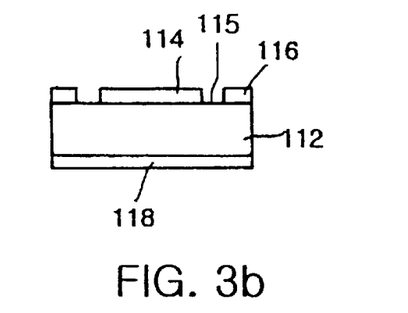
FIG. 3b is a side view.
Figure 4A:
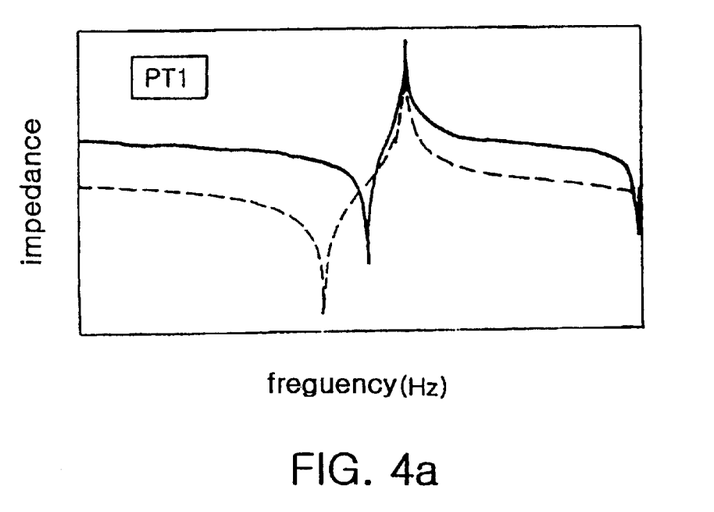
FIGS. 4a–4d are a graphical illustration showing the impedance characteristics of the piezoelectric transformer according to the present invention.
Figure 4B:
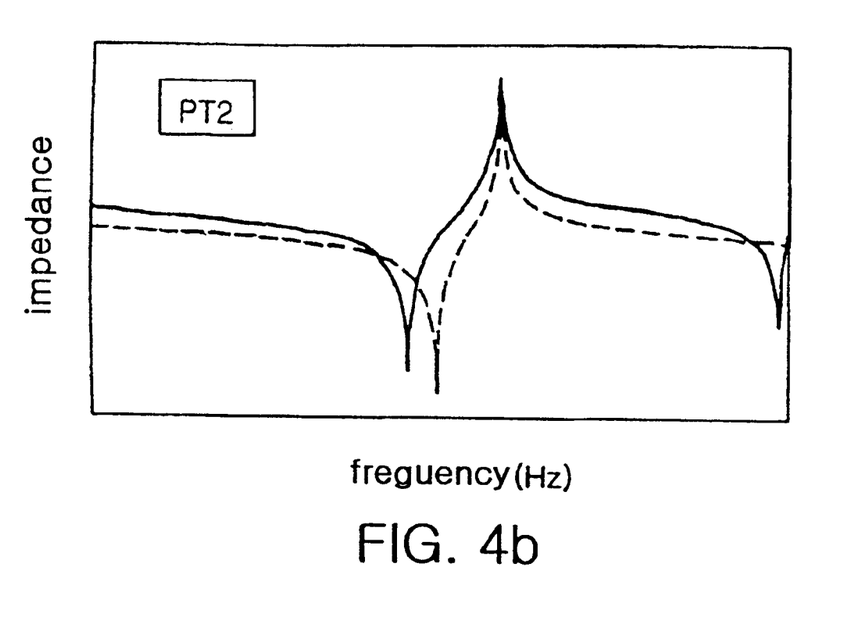
Figure 4C:
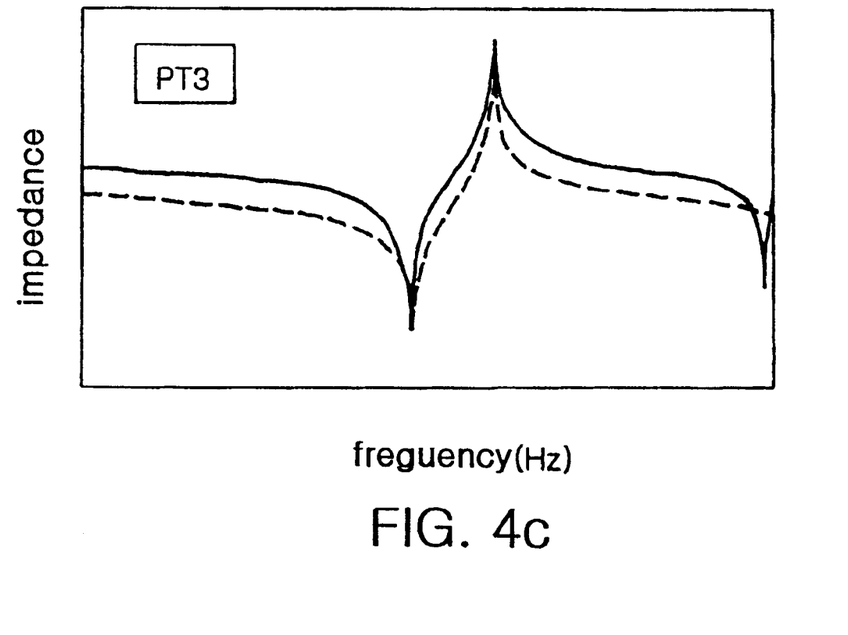
Figure 4D:
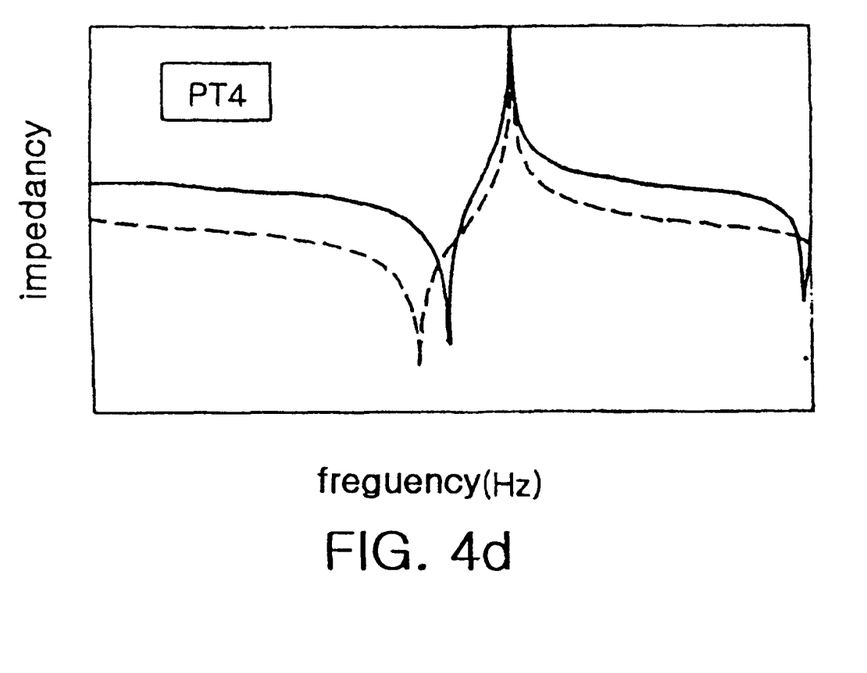
Figure 5A:
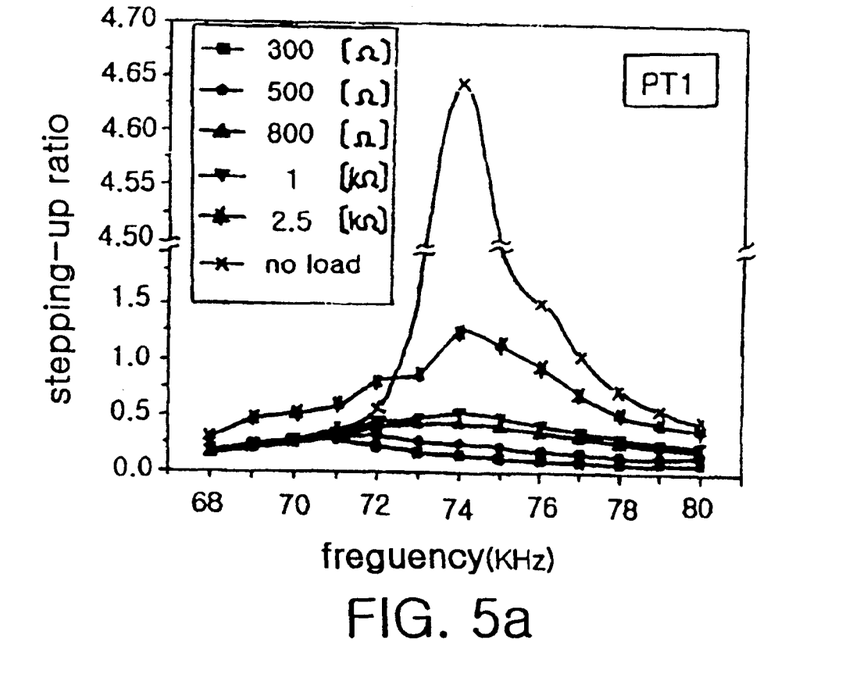
FIGS. 5a–5d are a graphical illustration showing the stepping-up ratio of the piezoelectric transformer with respect to the frequency and the load resistance.
Figure 5B:
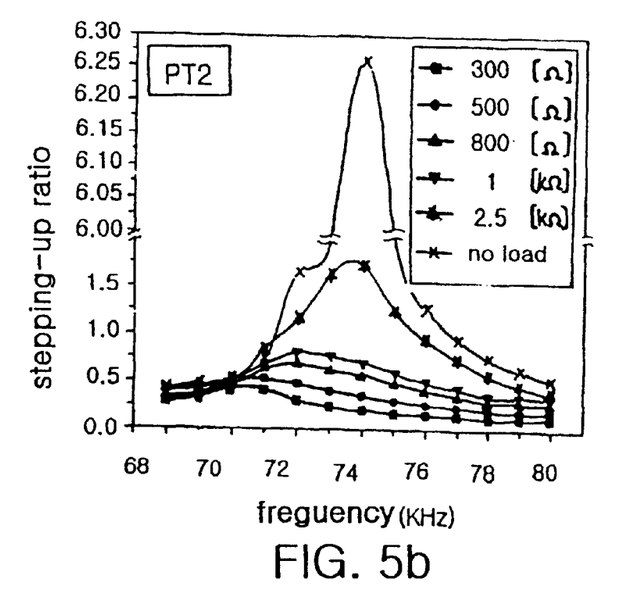
Figure 5C:
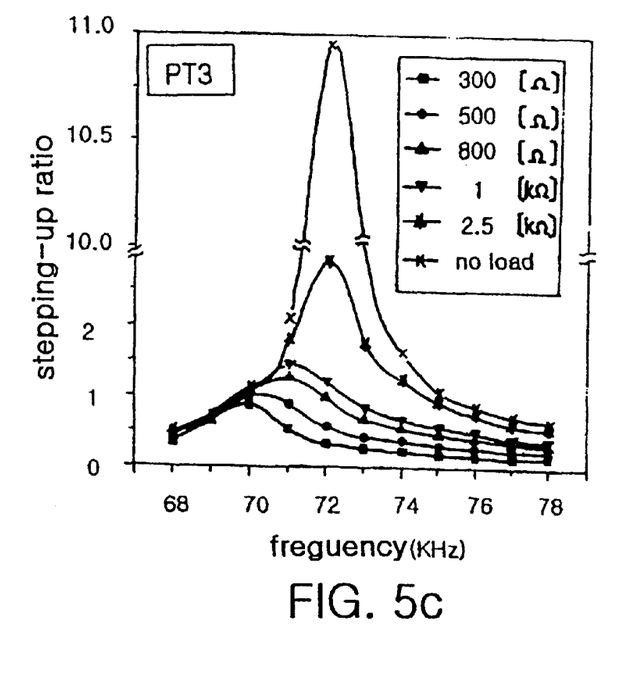
Figure 5D:
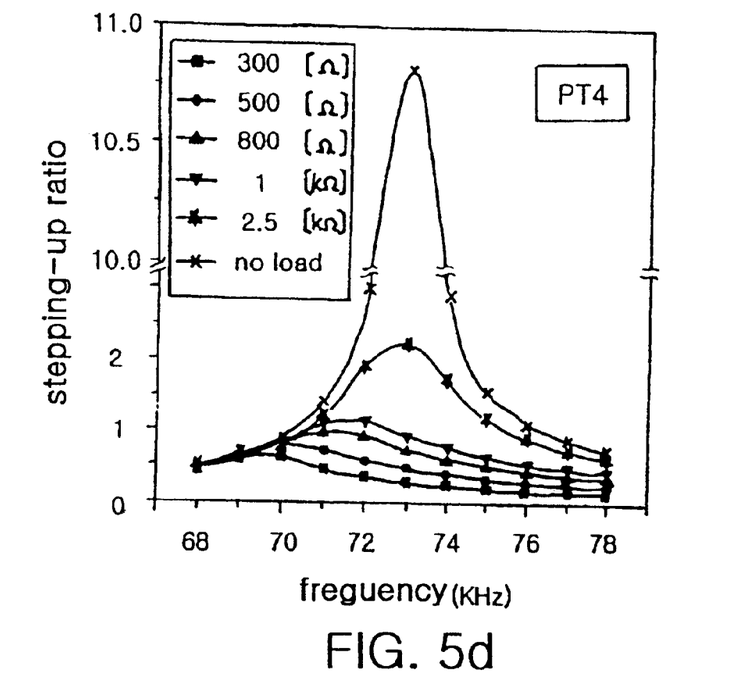

Thus the isolating region in which the electrodes are not formed is made to approach to the minimum oscillation regions P of the piezoelectric block, so that the volumes of the electrode at the minimum oscillation regions can be reduced to the minimum. That is, the corners of the isolating regions are made nearest to the middle points of the edges of the piezoelectric block. To define it, the points of the isolating region, which are nearest to the minimum oscillation points of the piezoelectric block, are farthest from the center of the piezoelectric block among all the distances from the center of the piezoelectric block to the edges of the isolating region. As shown in the example of FIG. 3, the four corners of an inner electrode 114 are made to project toward the middle points P of the edges of the piezoelectric block 112. At the same time, the isolating region 115 is designed such that its four corners are most proximal to the middle points of the edges of the piezoelectric block 112. Thus the inner electrode 114 and the isolating region 115 should be preferably of the diamond shape.

If the inner electrode 114 and the isolating region 115 are designed to be of the diamond shape, then the electromechanical coupling factor Kp of the lateral direction becomes larger than the coupling factor K31 of the lengthwise direction. Therefore, the energy efficiency is improved, and the capacitance at the output side is increased, resulting in that the impedance of the output side is decreased. Accordingly, the power can be stepped up. Further, if the input electrode is designed to be of the diamond shape, then the stepping-up ratio is decreased in the relative terms. Therefore, this type is advantageous for use in the fluorescent lamp in which the impedance is low during the lighting.

The first electrode which is formed on the top of the piezoelectric block 112 according to the present invention shows the minimum generation of heat, when the area ratio of the outer electrode to the inner electrode $[(\gamma^2-\beta^2)/\alpha^2]$, where $\alpha$, $\beta$ and $\gamma$ are those shown in FIG. 3] is 1.5–3.14. Further, if the inner electrode of the first electrode is made to be output electrode, and if the outer electrode is made to be input electrode to form a reverse driving type, then the transformer gives the most stable operating characteristics.

In the above, the inner electrode 114 of the first electrode was presented in the form of the diamond shape as an example, but it is not limited to this shape. In a polygonal piezoelectric block, if the portions of the electrode which are proximal to the middle points of the edges of the piezoelectric block are made small, then so much the stress received becomes smaller. As a result, the heat generation is reduced correspondingly, and the present invention is based on this principle. Accordingly, the design of the electrode can be carried out in diversified manners.

Now the present invention will be described more specifically based on actual examples.

<Example 1>

Compositions were formed as shown in Table 1 below. In carrying out this work, an electronic balance was used to measure the amounts of the ingredients. The measured test pieces were crushed by using zirconia balls, and after the crushing, they were dried in an electric oven. Then the dried powders were sorted by passing them through a sieve of 100 meshes, and then, they were calcinated by using an alumina crucible.

The calcinated test material was crushed again by means of zirconia balls, and was dried again in an electric oven. The calcinated test material was passed again through a sieve of 100 meshes, and then, a PVA solution was added to it to uniformly mix them. Then the test material was fabricated by a single shaft formation method or the CIP method by applying an equi-pressure of 7,000–20,000 psi. The fabricated product was baked at a temperature of 1200° C. After the baking, the test pieces were ground to a thickness of 1 mm by using sand papers and SiC powders. Then they were washed within acetone by using an ultrasonic washer. Then a silver paste was spread by a silk screening method, and then, a heat treatment was carried out. Then electrodes were formed on them, and then, the electrodes were polarized based on a high temperature polarizing method. That is, after forming the electrodes, the test pieces were put into a silicon oil of 1200° C., and then, an electric field of 30 KV/cm was imposed for 30 minutes, thereby polarizing the electrodes. Then the piezoelectric properties were measured.

TABLE 1

| Classification | $Pb[(Sb_{1/2}Nb_{1/2})_X (Zr_{0.495}Ti_{0.505})_{1-X}]O_3 + yPbO + zMnO$ | | |
| --- | --- | --- | --- |
| | X | Y | Z |
| S1 | 0.02 | 0.4 | 0.2 |
| S2 | 0.03 | 0.5 | 0.3 |
| S3 | 0.03 | 0.55 | 0.3 |
| S4 | 0.04 | 0.49 | 0.4 |
| S5 | 0.05 | 0.4 | 0.6 |

TABLE 2

| Classification | Dielectric constant | Kp | Qm | Ec [kV/cm] | Tc [° C.] | density [g/cm$^2$] |
| --- | --- | --- | --- | --- | --- | --- |
| S1 | 1,320 | 0.530 | 1,440 | 10.5 | 365 | 7.84 |
| S2 | 1,367 | 0.534 | 1,487 | 10.88 | 377 | 7.86 |
| S3 | 1,370 | 0.520 | 1,460 | 10.12 | 360 | 7.85 |
| S4 | 1,372 | 0.525 | 1,450 | 9.55 | 355 | 7.89 |
| S5 | 1,365 | 0.520 | 1,465 | 9.60 | 363 | 7.83 |

<Example 2>

Test pieces which have the composition S2 of Example 1 were formed into four samples (PT1, PT2, PT3 and PT4) of Table 3 below. Then electrodes were formed, and then, polarizations were carried out under an electric field of 25 KV/cm for 30 minutes, thereby manufacturing piezoelectric transformers.

TABLE 3

| Classification | PT1 | PT2 | PT3 | PT4 |
| --- | --- | --- | --- | --- |
| $\gamma$ | | 27.5 | | |
| $\beta$ | 11 | 13 | 15 | 17 |
| $\alpha$ | 9 | 11 | 13 | 15 |
| Area ratio of outer electrode to inner electrode $[(\gamma^2 - \beta^2)/\alpha^2]$, where $\alpha$, $\beta$ and $\gamma$ are those shown in FIG. 3 | 7.84 | 4.85 | 3.41 | 2.08 |

The impedance characteristics of the output terminal of the piezoelectric transformer of FIG. 3 were checked to show them in Table 4, while the electromechanical coupling factor and the mechanical quality factor were measured to show them in Table 5.

TABLE 4

|  | PT1 | PT2 | PT3 | PT4 |
|---|---|---|---|---|
| Cin[nF] | 0.553 | 0.784 | 1.060 | 1.285 |
| Cout[nF] | 3.077 | 2.895 | 2.750 | 2.350 |
| Zout[Ω] | 685 | 738 | 789 | 936 |

As can be seen in Table 4 above, the impedances of the output terminals of the piezoelectric transformers were 685–936 Ω, and therefore, all of them were thought to be matched to the load of fluorescent lamps.

TABLE 5

|  | Kp' | Qm' |
|---|---|---|
| PT1 | 0.314 | 1300 |
| PT2 | 0.360 | 1415 |
| PT3 | 0.416 | 967 |
| PT4 | 0.435 | 950 |

As shown in Table 5 above, the PT2 transformer showed the optimum overall values in view of the effective electromechanical coupling factor and the effective mechanical quality factor.

For the piezoelectric transformers of PT1, PT2, PT3 and PT4 of Table 3, the shifts of the resonance frequencies with respect to the area ratios of the output terminals to the input terminals and the overall size of the transformers were observed, and the results are illustrated in FIG. 4.

In FIG. 4, the solid lines are the impedance curves for the diamond shaped inner electrodes, and the dotted lines are the impedance curves for the outer electrodes.

According as the area of the diamond part, i.e., the input electrode is increased, Δf[KHz] (fa–fr) of the input part is so much increased. Therefore, the electromechanical conversion efficiency is improved, so that the area oscillations would be excellent. Further, if Δf is made to be maximum in both the input part and the output part, then the resonance frequencies of the input and output parts have to be matched to each other. In the case where the piezoelectric transformer is driven at the resonance frequency, if the resonance frequencies of the input and output parts are matched to each other, then the power output and the efficiency can be maximized. Therefore, the piezoelectric transformer of PT3 was most suitable.

Further, in Table 5, there is shown the stepping-up ratio of the piezoelectric transformer with respect to the load resistance and the frequency. The input voltage was 220 [Vrms] in all of them, and measurements were carried out at the load resistances of 300 Ω, 500 Ω, 800 Ω, 1 KΩ, 2.5 KΩ and zero load respectively.

If the piezoelectric transformer is to be used in a fluorescent lamp, the stepping-up ratios at a zero load and at 500 Ω are important. In the case of a fluorescent lamp of 14 watts (T5, 16 mm), the resistance is high before the lighting like at the zero load, but the resistance is lowered to 500 Ω after the lighting. In the case of 14 watts (T5), it has the rated features such as a lighting initiation voltage of 230 [V] or more, a post lighting output voltage of 82 [V], and an output current of 172 [mA]. In the case where the input voltage is 220 [V], the piezoelectric transformer has to show a stepping-up ratio of 1.04 at a zero load at the driving frequency, and a stepping-up ratio of 0.373 at a load resistance of 500 Ω. Therefore, if only the stepping-up ratio is considered, the piezoelectric transformer of PT3 shows a stepping-up ratio of 2.928 at zero load at the driving frequency (74 KHz), and the stepping-up ratio is 0.344 at the load resistance of 500 Ω. Therefore, this type is most suitable.

Figure 6:
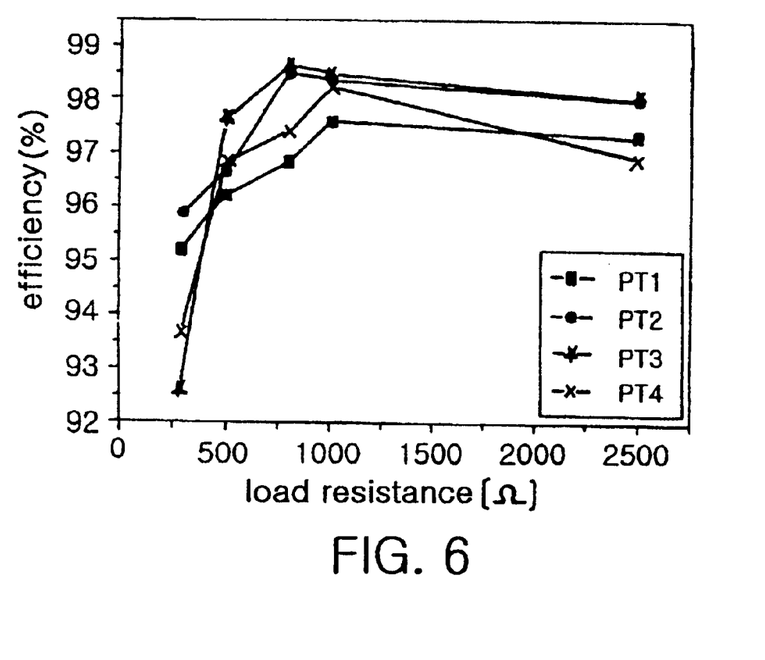
FIG. 6 is a graphical illustration showing the efficiency of the piezoelectric transformer with respect to the load resistance.

Meanwhile, FIG. 6 illustrates the result of the measurement on the efficiency with respect to the load resistance. The efficiency was 90% or more in all of the piezoelectric transformers. Except in PT1, according as the area of the input electrode of the piezoelectric transformers is increased, the load at which the maximum efficiency was seen was increased. Further, in the piezoelectric transformers of PT3 and PT4, the efficiencies were 98.6% and 98.2% at 800 Ω and 1 K Ω respectively.

Figure 7:
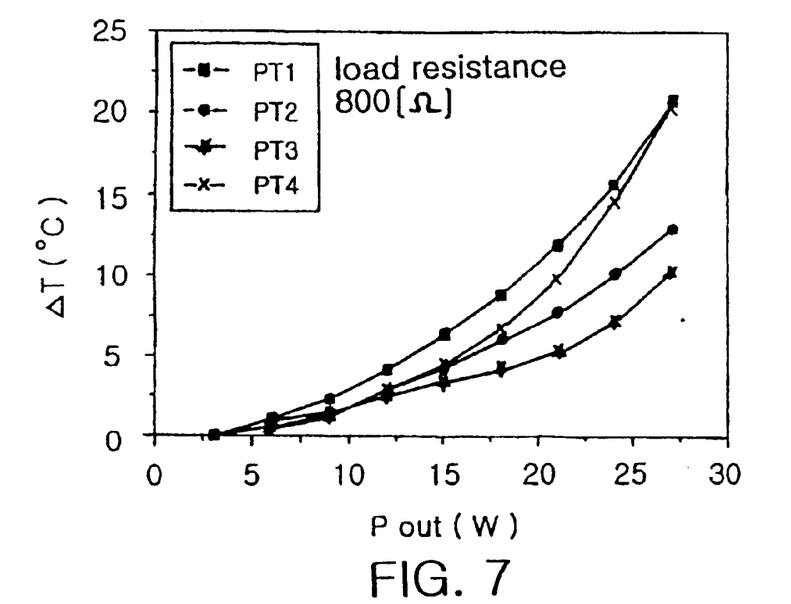
FIG. 7 is a graphical illustration showing the heat generation of the piezoelectric transformer with respect to the output power at the resonance frequency.

FIG. 7 is a graphical illustration showing the heat generation of the piezoelectric transformer with respect to the output power at the resonance frequency. In the piezoelectric transformer, according as the output power is increased, the heat generation tends to increase. This is thought to be due to the increase of the oscillation velocities as a consequence of the output current. The measurements of the temperature rise due to the output currents in PT1–PT4 showed that as the area of the input electrode of the piezoelectric transformer is increased, first the temperature rise was decreased and then was increased again. This is apparently due to the variation of the impedance with respect to the ratio of the output to input of the piezoelectric transformer. Further, the reason why PT3 showed the minimum heat generation at a load resistance of 800 Ω can be described referring to Table 4. That is, it is because the output impedance of the piezoelectric transformer of PT3 is 789 Ω which is almost equivalent to the load resistance 800 Ω.

Figure 8:
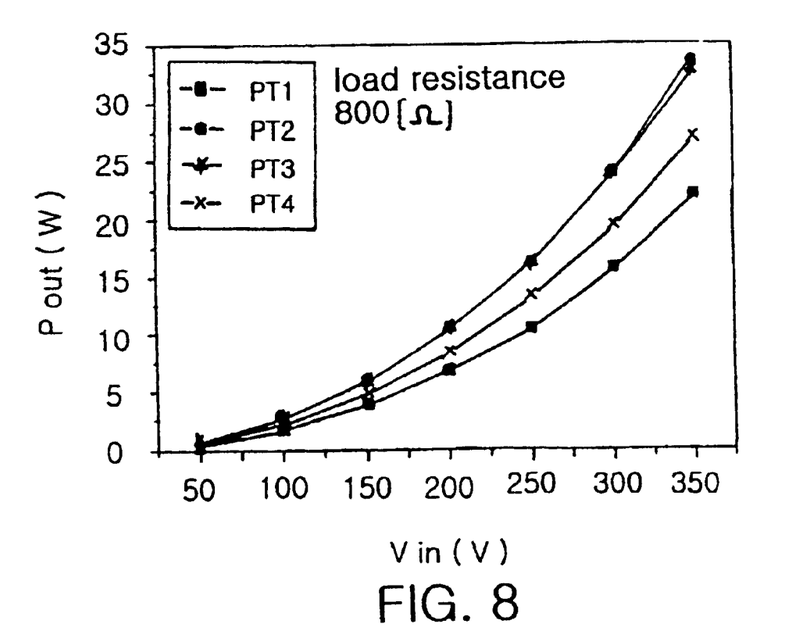
FIG. 8 is a graphical illustration showing the output of the piezoelectric transformer with respect to the input voltage at the resonance frequency.

FIG. 8 is a graphical illustration showing the output of the piezoelectric transformer with respect to the input voltage at the resonance frequency. In all of the piezoelectric transformers, the output power tended to increase according as the input voltage increased. The piezoelectric transformer of PT2 showed the maximum output power of 33.5 [W] at an input voltage of 350 [V] and at a load resistance of 800 Ω, thereby showing the highest output characteristics.

<Example 3>

A fluorescent lamp of 14 [W] was driven for 20 minutes, and then, the input current, the input voltage, the input power, the output current, the output voltage and the output power of the transformer were measured.

TABLE 6

|  | Fd [kHz] | Vin [V] | Iin [mA] | Vout [V] | Iout [mA] | Pout [W] | ΔT [° C.] | Efficiency [%] |
|---|---|---|---|---|---|---|---|---|
| PT1 | 73.5 | 298 | 111.6 | 86.4 | 173 | 14.95 | 20 | 96.4 |
| PT2 | 75.0 | 284 | 100 | 86.0 | 173 | 14.88 | 5 | 98.0 |
| PT3 | 74.0 | 210 | 105 | 85.6 | 174 | 14.89 | 7 | 97.6 |
| PT4 | 74.3 | 236 | 97.6 | 86.4 | 171 | 14.77 | 11 | 96.9 |

As shown in Table 6 above, except PT1, the temperature rise was less than 10° C., and thus, the values were relatively stable in all the other piezoelectric transformers. The reason why the piezoelectric transformer of PT1 was highest in generating the heat was that the area of the input part was too small, and therefore, the small input part could barely withstand against the input power of 14 watts or more. The reason why the temperature rise was lowest in PT2 was thought to be due to the fact that it is closer to the equivalent resistance 500 Ω than the other transformers. According as the area of the diamond part, i.e., input part was increased, so the input voltage was increased. That is, the stepping-up ratios at the initiation of the lighting and after the lighting at the driving frequency are important. During the research for the present invention, it was confirmed that the increase of the input voltage was related to the impedance Zr during the resonance of the output part. As the value of Zr was increased, so much the input voltage Vin was increased. Therefore, in designing the piezoelectric transformer, it is an important condition that the load of the fluorescent lamp be exactly matched with the output impedance of the piezoelectric transformer. Further, in order to inhibit the temperature rise of the piezoelectric transformer, it is important that the input be matched to the output.

According to the piezoelectric transformer of the present invention as described above:

(1) it has superior characteristics such that the dielectric constant is 1,320–1,372, the electromechanical coupling factor is 0.520–0.534, and the mechanical quality factor is 1,440–1,487;

(2) an efficiency of 90% or more is seen at load resistances 300–2.5 Ω, the maximum efficiency being 98.6% at 800 Ω; and (3) the temperature rise is 7° C. or less, and therefore, applicability will be superior at 220 [V].

What is claimed is:

1. A high output power piezoelectric transformer obtained by using a piezoelectric ceramic composition satisfying $Pb[(Sb_{1/2}Nb_{1/2})_x(Zr_{0.495}Ti_{0.505})_{1-x}]O_3+yPbO+zMnO$, where x is 0.01–0.05 mol %, y is 0.03–0.6 wt %, and z is 0.7 wt % or less.

2. A high output power piezoelectric transformer comprising:

a piezoelectric block composed of $Pb[(Sb_{1/2}Nb_{1/2})_x(Zr_{0.495}Ti_{0.505})_{1-x}]O_3+yPbO+zMnO$, where x is 0.01–0.05 mol %, y is 0.03–0.6 wt %, and z is 0.7 wt % or less;

a first electrode consisting of an inner electrode and an outer electrode, said inner electrode being formed at a center of a top of said piezoelectric block, and said outer electrode being formed around said inner electrode by being separated by an isolating region; and a second electrode formed on a bottom of said piezoelectric block.

3. The high output power piezoelectric transformer as claimed in claim 2, wherein points of said isolating region nearest to minimum oscillation points of said piezoelectric block are farthest from a center of said piezoelectric block among all distances from the center of said piezoelectric block to edges of said isolating region.

4. The high output power piezoelectric transformer as claimed in claim 3, wherein said isolating region is of a diamond shape.

5. The high output power piezoelectric transformer as claimed in claim 2, wherein an area ratio of said outer electrode to said inner electrode $(\gamma^2-\beta^2)/\alpha^2$ is provided at a range of 3.1–4.85.

6. The high output power piezoelectric transformer as claimed in claim 2, wherein said inner electrode is an output electrode, and said outer electrode is an input electrode, to form a reverse driving type.

* * * * *